United States Patent
Hsu et al.

(10) Patent No.: US 9,685,316 B2
(45) Date of Patent: Jun. 20, 2017

(54) SEMICONDUCTOR PROCESS

(71) Applicant: UNITED MICROELECTRONICS CORP., Hsin-Chu (TW)

(72) Inventors: Chia Chang Hsu, Kaohsiung (TW); Kuo-Chih Lai, Tainan (TW); Chun-Ling Lin, Tainan (TW); Bor-Shyang Liao, Kaohsiung (TW); Pin-Hong Chen, Yunlin County (TW); Shu Min Huang, Tainan (TW); Min-Chung Cheng, Chiayi County (TW); Chi-Mao Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 47 days.

(21) Appl. No.: 13/775,273

(22) Filed: Feb. 25, 2013

(65) Prior Publication Data

US 2014/0242802 A1  Aug. 28, 2014

(51) Int. Cl.
| | |
|---|---|
| H01L 21/302 | (2006.01) |
| B44C 1/22 | (2006.01) |
| C03C 15/00 | (2006.01) |
| C03C 25/68 | (2006.01) |
| C23F 1/00 | (2006.01) |
| H01L 21/02 | (2006.01) |
| H01L 21/3213 | (2006.01) |
| H01L 21/311 | (2006.01) |
| H01L 21/768 | (2006.01) |
| H01L 21/67 | (2006.01) |
| H01L 21/3065 | (2006.01) |
| H01L 21/285 | (2006.01) |

(52) U.S. Cl.
CPC .. H01L 21/02063 (2013.01); H01L 21/31111 (2013.01); H01L 21/31116 (2013.01); H01L 21/32136 (2013.01); H01L 21/6708 (2013.01); H01L 21/67109 (2013.01); H01L 21/76804 (2013.01); H01L 21/76814 (2013.01); H01L 21/28518 (2013.01); H01L 21/3065 (2013.01)

(58) Field of Classification Search
None
See application file for complete search history.

(56) References Cited

U.S. PATENT DOCUMENTS

| | | | |
|---|---|---|---|
| 6,258,716 B1* | 7/2001 | Ku | H01L 21/76879 257/E21.586 |
| 7,550,381 B2* | 6/2009 | Lu et al. | 438/655 |
| 2001/0006147 A1* | 7/2001 | Fan | 204/192.3 |
| 2001/0006240 A1* | 7/2001 | Doan | C23C 16/02 257/296 |
| 2002/0034867 A1* | 3/2002 | Huang | H01L 21/02046 438/592 |
| 2009/0095621 A1* | 4/2009 | Kao et al. | 204/298.32 |

* cited by examiner

Primary Examiner — Stephanie Duclair
(74) Attorney, Agent, or Firm — Winston Hsu

(57) ABSTRACT

A semiconductor process includes the following steps. A wafer on a pedestal is provided. The pedestal is lifted to approach a heating source and an etching process is performed on the wafer. An annealing process is performed on the wafer by the heating source. In another way, a wafer on a pedestal, and a heating source on a same side of the wafer as the pedestal are provided. An etching process is performed on the wafer by setting the temperature difference between the heating source and the pedestal larger than 180° C.

8 Claims, 2 Drawing Sheets

SEMICONDUCTOR PROCESS

BACKGROUND OF THE INVENTION

1. Field of the Invention

The present invention generally relates to a semiconductor process, and more specifically to a semiconductor process that enlarges the temperature gradient of a wafer to improve a metal silicide quality formed in the wafer.

2. Description of the Prior Art

A metal silicide is often used on contact surfaces between silicon (substrate/gates) and metal (wires/contact plugs). The metal silicide not only can reduce the contact resistance or the gate resistance to improve the driving current, the reactive time or the operation speed of the formed semiconductor component, but also can be formed through a self-alignment process. In general, the salicide (self-aligned silicide) process is performed after gates, and spacers, source/drains formed beside the gates are formed, and the salicide process is performed to form the metal silicide on silicon substrate/gates directly without further performing lithography processes to the silicon substrate/gates by the structural features itself. For example, when the metal films for forming the metal silicide are deposited on the silicon substrate/gates and the annealing processes are performed, the metal on the silicon surfaces of source/drains and gates of MOS transistors will be transformed into metal silicide, but other parts such as isolation areas or spacers won't have metal silicide formed thereon, and can therefore be removed through selective wet etching processes.

As the semiconductor processes are developing and the semiconductor components size continually reduces, salicide processes should be improved accordingly.

SUMMARY OF THE INVENTION

The present invention provides a semiconductor process to improve a metal silicide quality of a wafer by increasing the temperature gradient of the wafer, such as increasing the temperature difference between a showerhead and a pedestal at both sides of the wafer during the process.

The present invention provides a semiconductor process including the following steps. A wafer on a pedestal is provided. The pedestal is lifted to approach a heating source and an etching process is performed on the wafer. An annealing process is performed on the wafer by the heating source.

The present invention provides a semiconductor process including the following steps. A wafer on a pedestal and a heating source on an opposite side of the wafer of the pedestal are provided. An etching process is performed on the wafer by setting a temperature difference between the heating source and the pedestal larger than 180° C.

According to the above, the present invention provides a semiconductor process, which disposes a wafer on a pedestal, and then lifts the pedestal to approach a heating source and performs an etching process on the wafer, so that the temperature surrounding the wafer during the etching process can be higher than the temperature without the pedestal being approached. Therefore, the etching rate to the wafer can be decreased thanks to the higher temperature. Furthermore, the temperature difference between the heating source and the pedestal is larger than 180° C. during the etching process. Thus, the vertical etching rate of the etching process to the wafer can be maintained without decreasing, thanks to the higher temperature achieved by lifting the pedestal. As a result, the critical dimension (CD) of a contact hole formed in the wafer can be reduced due to the relatively lower lateral etching rate, the bottom cleaning efficiency of the contact hole can be improved due to the relatively higher vertical etching rate, and the profile of the contact hole can therefore have a vertical sidewall.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
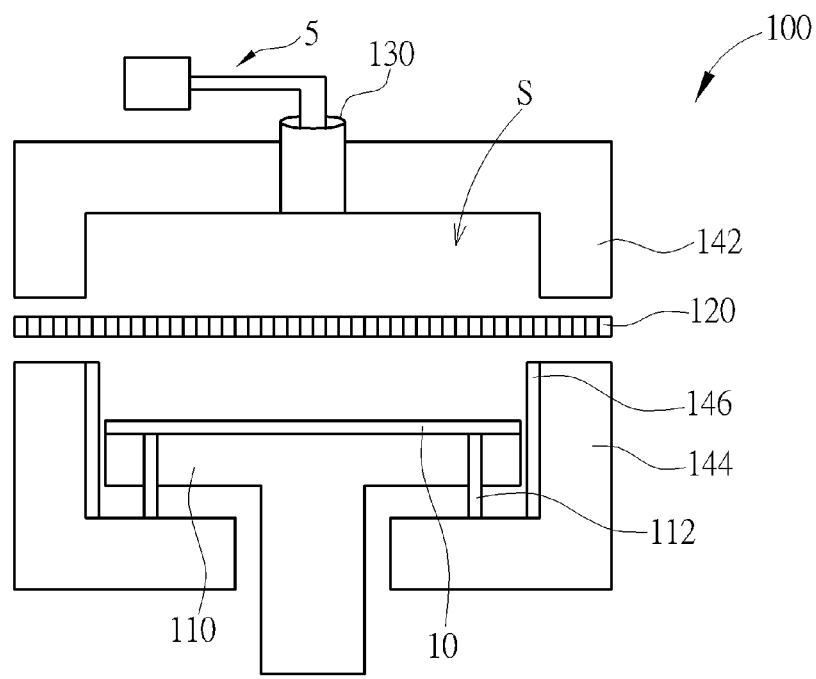
FIGS. 1-3 schematically are cross-sectional views of a semiconductor process according to an embodiment of the present invention.
Figure 2:
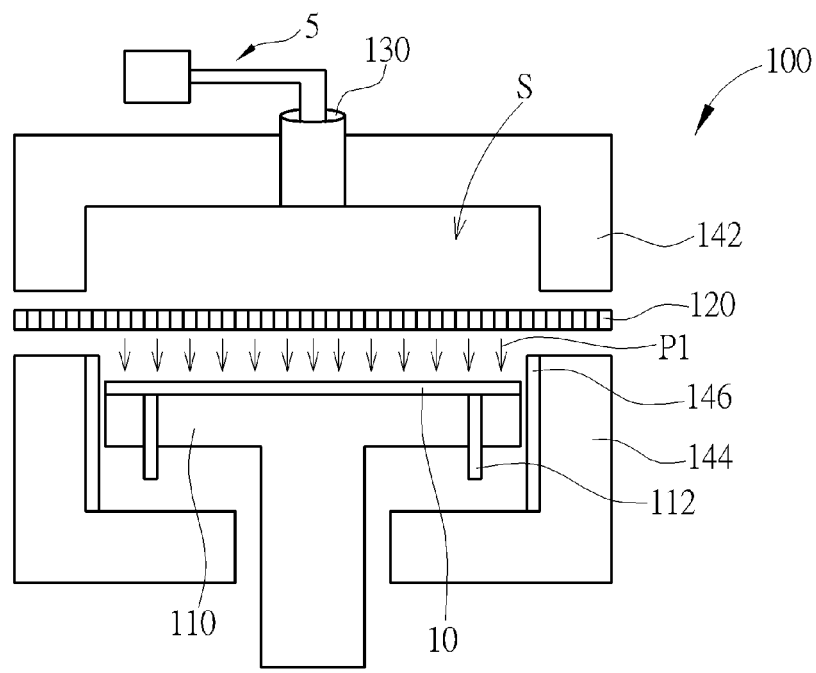
Figure 3:
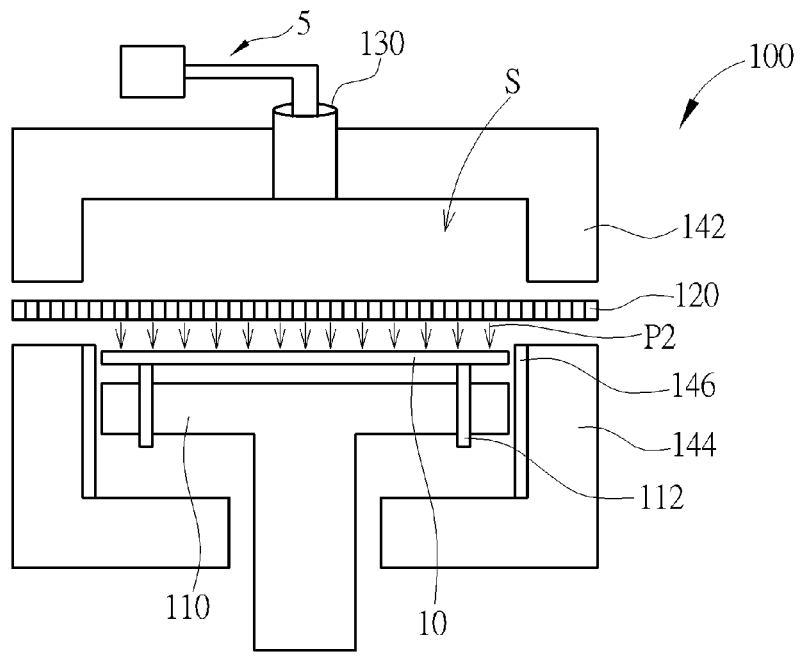
Figure 4:
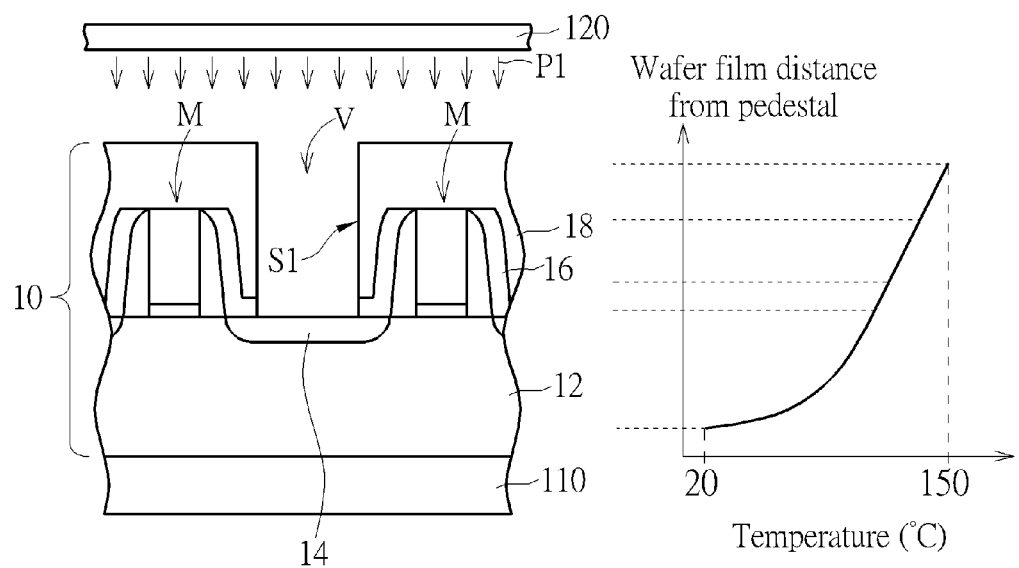
FIG. 4 schematically is a cross-sectional view and a curve of the distance of the wafer from the pedestal versus the temperature.

FIGS. 1-3 schematically are cross-sectional views of a semiconductor process according to an embodiment of the present invention. FIG. 4 is a cross-sectional view and a curve of the distance of the wafer from the pedestal versus the temperature. The semiconductor process of the present invention in this embodiment is a cleaning process such as a remote plasma clean (RPC) process, but the present invention is not restricted to it.

As shown in FIG. 1, the remote plasma clean (RPC) process is performed with a remote plasma cleaning equipment 100, but it is not limited thereto. The remote plasma cleaning equipment 100 includes a pedestal 110 for disposing a wafer 10 thereon. The wafer 10 can be cooled down and etchants can be condensed by adjusting the temperature of the pedestal 110 during an etching process, so that the etching rate of the etching process to the wafer 10 can be controlled.

A heating source 120 is located on an opposite side of the wafer 10 of the pedestal 110 for heating the wafer 10. The heating source 120 in this embodiment is a showerhead for uniformly spreading etchants to the wafer 10. Moreover, the heating source 120 temperature is higher than that of the pedestal 110, so that the heating source can heat the wafer 10. Because of the higher temperature of the heating source 120 and the etchant spreading capability of the heating source 120, the pedestal 110 can therefore be called a cold pedestal while the heating source 120 is called a hot showerhead.

A plasma cavity 130 is located on an opposite side of the heating source 120 and a space S is surrounded by the plasma cavity 130, the heating source 120 and an upper chamber wall 142. Firstly, remote plasma such as ammonia ($NH_3$) plasma or nitrogen trifluoride ($NF_3$) plasma can be contained in the plasma cavity 130 as etchants to perform an etching process, and a quantity of plasma required for etching will be diffused into the space S between the plasma cavity 130 and the heating source 120. Then, the plasma required for etching can spread uniformly onto the wafer 10 through the heating source 120. Furthermore, the plasma in the plasma cavity 130 may be generated in a remote plasma generation unit 5 and then transferred to the plasma cavity 130, but it is not limited thereto. In another case, the plasma in the plasma cavity 130 may be directly generated by gases in the plasma cavity 130.

Moreover, a plurality of pins 112 is mounted within the pedestal 110 for selectively lifting the wafer 10 during processes, such as an etching process or an annealing process. A lower chamber wall 144 surrounding the pedestal 110 is used to prevent the etchants from condensing, such as the plasma spread from the heating source 120 or byproducts generated after etching the wafer 10. A pumping channel 146 is disposed on the sidewalls of the lower chamber wall 144 for pumping or removing the byproducts uniformly.

Please refer now to FIG. 2 and FIG. 4, which schematically depict the cross-sectional views and a curve of the distance of the wafer from the pedestal versus the temperature. The wafer 10 is disposed on the pedestal 110 and the heating source 120 is disposed on the opposite side of the wafer 10 of the pedestal 110. The wafer 10 may include metal gates M located on a substrate 12, source/drains 14 located in the substrate 12 beside the metal gates M, a contact etch stop layer 16 and an interdielectric layer 18 sequentially covering the metal gates M and the substrate 12 (but that may expose parts of the metal gates M). A contact hole V is formed in the interdielectric layer 18, and the following etching process P1 and annealing process P2 may be applied to clean the contact hole V after the contact hole V is formed by another suitable etching process (not shown) and before a salicide process is performed.

The pedestal 110 is lifted to approach the heating source 120, and so does the wafer 10. Then, an etching process P1 is performed on the wafer 10 to clean residues left in the contact hole V, wherein the etching process P1 in this embodiment is a plasma etching process, and the plasma comprises ammonia ($NH_3$) plasma or nitrogen trifluoride ($NF_3$) plasma used as etchants and provided through the heating source 120. It is emphasized that the etching rate of the etching process P1 to the wafer 10 will decrease when the pedestal 110 is lifted to approach the heating source 120 because of the wafer 10 being closer to the heating source 120, which means that the wafer 10 has a higher temperature than the wafer 10 without the pedestal 110 being lifted. Thus, the interdielectric layer 18 of the wafer 10 can be etched with a lower lateral etching rate thanks to the higher temperature.

Moreover, the temperature difference between the heating source 120 and the pedestal 110 in this embodiment is set to be larger than 180° C. In a preferred embodiment, the temperature of the heating source 120 is higher than or equal to 200° C., and the temperature of the pedestal 110 is lower than or equal to 20° C., but it is not limited thereto. In a still preferred embodiment, the temperature of the pedestal 110 is lower than or close to 0° C. Thus, compared to other processes, wherein the temperature of the heating source is lower than or equal to 180° C., and the temperature of the pedestal is higher than or equal to 30° C., the temperature difference between the heating source 120 and the pedestal 110 in the present invention can keep the vertical etching rate of the etching process P1, which would be reduced otherwise.

Due to the relative lower lateral etching rate and the relative higher vertical etching rate of the etching process P1, the critical dimension (CD) of the contact hole V can be reduced (thanks to the relative lower lateral etching rate), the bottom cleaning efficiency of the contact hole V can be improved (thanks to the relative higher vertical etching rate), and the profile of the contact hole V in the interdielectric layer 18 can have a vertical sidewall S1.

As shown in FIG. 3, an annealing process P2 is performed on the wafer 10 by the heating source 120. In this embodiment, the wafer 10 is lifted by pins 112 mounted within the pedestal 110 during the annealing process for heating the wafer 10 at a higher temperature; in another embodiment, the annealing process P2 may be performed without moving the pedestal 110, depending upon the practical needs. The distance between the heating source 120 and the wafer 10 during the process of the present invention maybe hundred mils (1 mil equals to $10^{-3}$ inch). When the wafer 10 is not lifted by the pedestal 110 and the pins 112, the distance between the heating source 120 and the wafer 10 may approach 700 mils. When the wafer 10 is lifted by the pedestal 110 or/and the pins 112, the distance between the heating source 120 and the wafer 10 can shrink to 150 mils or even less. Moreover, the import of plasma used as etchants to etch the wafer 10 of the previous etching process P1 is stopped, and inert gases such as argon or hydrogen gases are preferably imported instead, in order to prevent the wafer 10 from being polluted, oxidized or transformed by imported gases.

In one case, the etching process P1 and the annealing process P3 may include the following chemical reaction, but it is not limited thereto.

Etching Process P1:

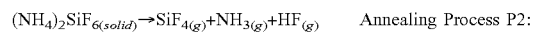

Annealing Process P2: $(NH_4)_2SiF_{6(solid)} \rightarrow SiF_{4(g)} + NH_{3(g)} + HF_{(g)}$ Thereafter, a salicide process may be performed to form a metal silicide in the contact hole V on the substrate 12 as shown in FIG. 4. Thus, the semiconductor process in this embodiment is a pre-cleaning process of a salicide process, used for removing the residues such as native oxides in the contact hole V so that the metal silicide can be formed on the source/drains closely, thereby forming semiconductor components having good reliabilities. In addition, the semiconductor process of the present invention can be applied in other processes, especially for etching/cleaning holes or recesses.

Moreover, the right diagram of FIG. 4 is a temperature profile curve of the wafer 10 corresponding to the distance in the wafer 10 from the pedestal 110 shown in the left diagram of FIG. 4. The horizontal dash lines point each part of the wafer 10 and their corresponding temperature in the temperature profile curve. Generally, the highest temperature of the wafer 10 is lower than the temperature of the heating source 120, such as 200° C. In one case, when the temperature of the heating source 120 is set to be 180° C., the highest temperature of the wafer 10 may be just 150° C.

To summarize, the present invention provides a semiconductor process, which disposes a wafer on a pedestal, and then lifts the pedestal to approach a heating source (without lifting the pins) and performs an etching process on the wafer, so that the temperature surrounding the wafer during the etching process can be higher than the temperature without the pedestal being lifted. Therefore, the etching rate to the wafer, especially the lateral etching rate to the wafer, can be decreased due to the higher temperature. Furthermore, the temperature difference between the heating source and the pedestal is larger than 180° C. during the etching process. In a preferred embodiment, the temperature of the heating source is higher than or equal to 200° C., and the temperature of the pedestal is lower than or equal to 20° C. The vertical etching rate of the etching process to the wafer can therefore be maintained without reducing the high temperature brought by lifting the pedestal. Thus, when the semiconductor process is applied to clean a contact hole in the wafer, the critical dimension (CD) of the contact hole can be reduced due to relative lower lateral etching rate; the bottom cleaning efficiency of the contact hole can be improved due to the relative higher vertical etching rate, and the profile of the contact hole can therefore have a vertical sidewall.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
providing a wafer on a pedestal;
lifting the pedestal to approach a heating source and performing an etching process on the wafer after a contact hole of the wafer being formed; and
performing an annealing process on the wafer by the heating source to remove byproducts generated after the etching process in order to complete a pre-cleaning process of a salicide process comprising the etching process and the annealing process for forming a metal silicide in the contact hole of the wafer capable of maintaining vertical sidewalls of the contact hole of the wafer by increasing vertical etching rate while reducing lateral etching rate during the etching process through controlling of temperature difference between the heating source and the pedestal by lifting the pedestal to approach the heating source during the etching process, wherein the annealing process is performed without moving the wafer.

2. The semiconductor process according to claim 1, further comprising:
a plurality of pins located on the pedestal.

3. The semiconductor process according to claim 1, wherein the temperature difference between the heating source and the pedestal is larger than 180° C. during the etching process.

4. The semiconductor process according to claim 1, wherein the temperature of the heating source is higher than or equal to 200° C. during the etching process.

5. The semiconductor process according to claim 1, wherein the temperature of the pedestal is lower than or equal to 20° C. during the etching process.

6. The semiconductor process according to claim 1, wherein the etching process is a plasma etching process.

7. The semiconductor process according to claim 1, wherein argon or hydrogen gases are imported during the annealing process.

8. The semiconductor process according to claim 1, wherein the semiconductor process comprises a cleaning process.

* * * * *